US009204755B1

(12) United States Patent
Zoucha

(10) Patent No.: US 9,204,755 B1
(45) Date of Patent: Dec. 8, 2015

(54) APPARATUS FOR COOKING OR HEATING FOOD OR LIQUIDS

(71) Applicant: James Zoucha, Orchard, NE (US)

(72) Inventor: James Zoucha, Orchard, NE (US)

(*) Notice: Subject to any disclaimer, the term of this patent is extended or adjusted under 35 U.S.C. 154(b) by 489 days.

(21) Appl. No.: 13/731,368

(22) Filed: Dec. 31, 2012

Related U.S. Application Data

(63) Continuation-in-part of application No. 13/532,153, filed on Jun. 25, 2012, now Pat. No. 8,816,254.

(51) Int. Cl.
| | | |
|---|---|---|
| *A21B 1/00* | (2006.01) | |
| *A21B 1/22* | (2006.01) | |
| *A22C 7/00* | (2006.01) | |
| *A23P 1/00* | (2006.01) | |
| *A47J 43/18* | (2006.01) | |
| *A47J 37/07* | (2006.01) | |
| *H01L 21/67* | (2006.01) | |
| *H05B 3/74* | (2006.01) | |
| *A47J 37/06* | (2006.01) | |

(52) U.S. Cl.
CPC ........... *A47J 37/07* (2013.01); *H01L 21/67115* (2013.01); *A47J 37/0694* (2013.01); *H05B 3/748* (2013.01)

(58) Field of Classification Search
CPC .. H01L 21/67115; A47J 27/004; A47J 27/04; A47J 36/24; A47J 37/0676; A47J 37/0694; A47J 37/1295; A47J 37/0763; A47J 37/1219; A47J 37/0786; A47J 37/08; A47J 37/0688; A47J 37/0704; F24C 15/102; F24C 15/36; F24C 15/08; F24C 3/14; F24C 3/12; F24C 3/027; A21B 1/02; H05B 3/681; F24B 1/205
USPC ........... 219/411, 429, 430, 432, 450.1, 451.1, 219/452.11, 452.12, 453.11, 453.12, 405; 99/426, 416, 449, 410, 413, 414, 402, 99/419, 444, 385, 390, 393, 400, 401; 126/201, 50, 40, 42, 39 B, 55, 39 C, 30, 126/9 R, 9 B
See application file for complete search history.

(56) References Cited

U.S. PATENT DOCUMENTS

| | | | |
|---|---|---|---|
| 3,561,422 A * | 2/1971 | Colin-Smith | 126/92 B |
| 4,089,258 A * | 5/1978 | Berger | 99/339 |
| 4,421,015 A | 12/1983 | Masters et al. | |
| 5,761,990 A * | 6/1998 | Stewart et al. | 99/401 |
| 6,276,356 B1 | 8/2001 | Ragland et al. | |
| 6,732,637 B2 | 5/2004 | Artt | |
| 6,884,065 B2 * | 4/2005 | Vandrak et al. | 432/222 |
| 7,800,024 B2 * | 9/2010 | Duguay et al. | 219/460.1 |

* cited by examiner

*Primary Examiner* — Dana Ross
*Assistant Examiner* — Hemant Mathew
(74) *Attorney, Agent, or Firm* — Dennis L. Thomte; Thomte Patent Law Office LLC

(57) ABSTRACT

The apparatus of this invention relates to a device for heating or cooking food or liquids such as soup, water, roast, etc. A downwardly curved visor-like deflector is selectively removably positioned outwardly of the upper end of the radiation disk of an infrared heater so as to extend outwardly therefrom. The deflector has an upwardly presented cooking utensil opening formed therein and a horizontally disposed cooking utensil support secured to the deflector at the inner surface thereof below the cooking utensil opening. The cooking utensil support dwells in a plane below the upper end of the radiation disk whereby infrared rays emitted from the radiation disk will impinge upon the cooking utensil support and a cooking utensil positioned on the cooking utensil support to cook or heat the contents thereof. Other accessories may also be attached to the heater.

5 Claims, 4 Drawing Sheets

APPARATUS FOR COOKING OR HEATING FOOD OR LIQUIDS

CROSS REFERENCE TO RELATED APPLICATION

This is a Continuation-In-Part of application Ser. No. 13/532,153, filed Jun. 25, 2012 entitled APPARATUS FOR COOKING OR HEATING FOOD OR LIQUIDS.

BACKGROUND OF THE INVENTION

1. Field of the Invention

This invention relates to an apparatus for heating liquids such as soup, water, etc. The invention may also be used to cook or heat food such as a roast, etc. Even more particularly, the apparatus of this invention includes an infrared heater visor-like deflector selectively secured to the frame of the heater so as to be positioned at the upper discharge end of the radiation disk of the infrared heater with the visor or deflector having a utensil support provided thereon for supporting pots, kettles, etc. Further, the structure for mounting the deflector on the heater also enables other accessories to be selectively removably secured to the heater.

2. Description of the Related Art

Many attempts have been previously provided for cooking foods by way of radiant heat. For example, see U.S. Pat. Nos. 4,089,258; 4,421,015; 6,276,356; and 6,732,637. Although the devices of the prior art may cook food with radiant heat, the prior art devices seem to be very complicated and expensive. Further, it is not believed that the prior art methods of cooking foods are convenient to use and perhaps do not perform the cooking operation in a satisfactory manner. Further, the prior art devices do not provide an attachment which may be connected to and supported by a conventional infrared radiant heater such as those infrared radiant heaters of the Val6 Series manufactured by Shizouka Seika Co., Ltd., having an address of 4-1 Yamana, Fukuroi-shi, Shizouka-ken, Japan 437-8601.

In the co-pending application Ser. No. 13/532,153, filed Jun. 25, 2012, an apparatus is disclosed for cooking or heating food or liquids. In that application, the visor-like deflector was attached directly to the radiation disk. The direct attachment of the deflector to the radiation disk in the co-pending application works very well but could possibly raise a warranty issue with respect to the heater.

In an earlier patent application of Applicant, Ser. No. 13/494,123, filed Jun. 12, 2012, entitled APPARATUS FOR COOKING FOOD, an improved apparatus was disclosed for cooking food such as meat, seafood, chicken, etc. The invention of the co-pending application Ser. No. 13/532,153, provides an additional way of cooking or heating food or liquids. The instant invention is a further improvement in the cooking or heating art through the use of an infrared heater.

SUMMARY OF THE INVENTION

This Summary is provided to introduce a selection of concepts in a simplified form that are further described below in the Detailed Description. This Summary is not intended to identify key aspects or essential aspects of the claimed subject matter. Moreover, this Summary is not intended for use as an aid in determining the scope of the claimed subject matter.

An apparatus is disclosed for heating or cooking food or for heating liquids such as soup or water. The apparatus is designed to be used with an infrared radiant heater having a discharge end from which infrared rays are emitted therefrom. The infrared heater includes a frame which is preferably supported by wheels. The heater could also be of the non-wheeled type.

A first mounting bracket is secured to the heater frame at one side or end thereof. A second mounting bracket is secured to the heater frame at another side or end thereof. The first mounting bracket includes a first elongated horizontally disposed tubular member secured to the heater frame. A second elongated and horizontally disposed tubular member is secured to the first tubular member at the upper side thereof. A vertically disposed tubular member extends upwardly from the first and second tubular members. The second mounting bracket includes a first elongated and horizontally disposed tubular member secured to the heater frame. A second elongated and horizontally disposed tubular member secured to the heater frame. A second elongated and horizontally disposed tubular member is secured to the first tubular member of the second mounting bracket at the upper side thereof. A vertically disposed tubular member extends upwardly from the first and second tubular members of the second mounting bracket.

A deflector support is selectively removably secured to the first and second mounting brackets at the discharge end of the heater. A downwardly curved visor-like deflector is secured to the deflector support so as to be positioned outwardly of the upper end of the radiation disk of the heater and extends outwardly therefrom. The deflector has inner and outer surfaces. The deflector also has an upwardly presented cooking utensil opening formed therein. The deflector has a horizontally disposed cooking utensil support secured to the deflector at the inner surface thereof below the cooking utensil opening. The cooking utensil support dwells in a plane below the upper end of the radiation disk of the heater whereby infrared rays being emitted from the radiation disk will impinge upon the cooking utensil support and a cooking utensil thereon to cook or heat the contents of a cooking utensil positioned on the cooking utensil support.

The deflector support also has supporting structure secured thereto for supporting a cooking basket forwardly of the radiation disk of the heater. The first and second mounting brackets also enable a protective grill to be secured to the heater.

It is therefore a principal object of the invention to provide an improved apparatus for cooking or heating food or liquids.

A further object of the invention is to provide a visor-like deflector which is selectively removably positioned outwardly of the upper end of the radiation disk of an infrared heater with the deflector having a cooking utensil opening formed therein and a cooking utensil support secured to the underside of the deflector below the cooking utensil opening.

A further object of the invention is to provide an apparatus of the type described which ensures that the food or liquids being cooked or heated will be quickly and easily heated or cooked with a minimum amount of time.

A further object of the invention is to provide an apparatus for heating or cooking food or liquids which is easily secured to a conventional infrared heater at the discharge side thereof above the radiation disk of the heater.

A further object of the invention is to provide mounting bracketry which enables other accessories to be secured to the heater.

A further is to provide an apparatus for cooking or heating food or liquids which is economical of manufacture, durable in use and refined in appearance.

These and other objects will be apparent to those skilled in the art.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DESCRIPTION OF THE PREFERRED EMBODIMENT

Figure 1:
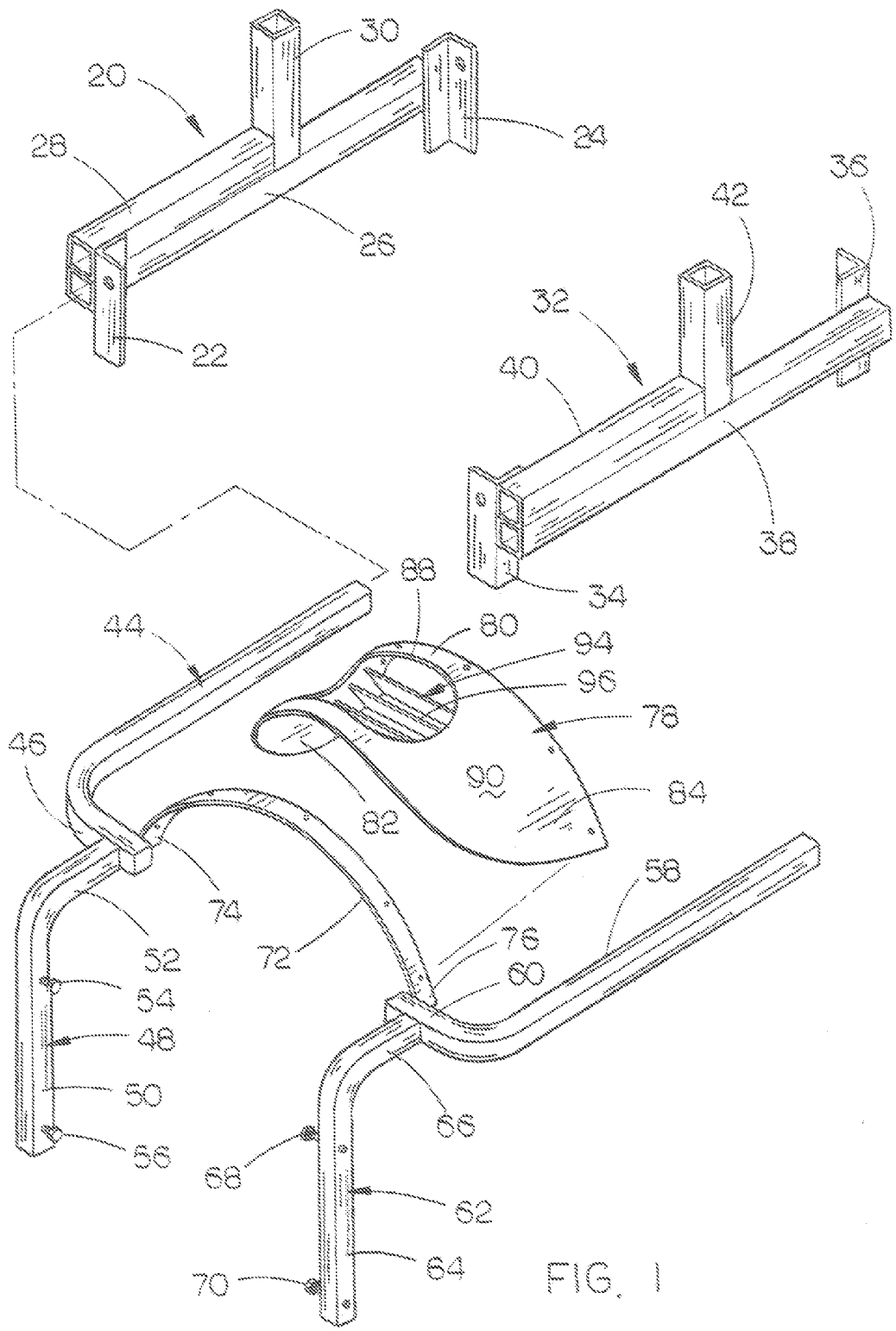
FIG. 1 is an exploded perspective view of the apparatus of this invention and the bracketry associated therewith.
Figure 2:
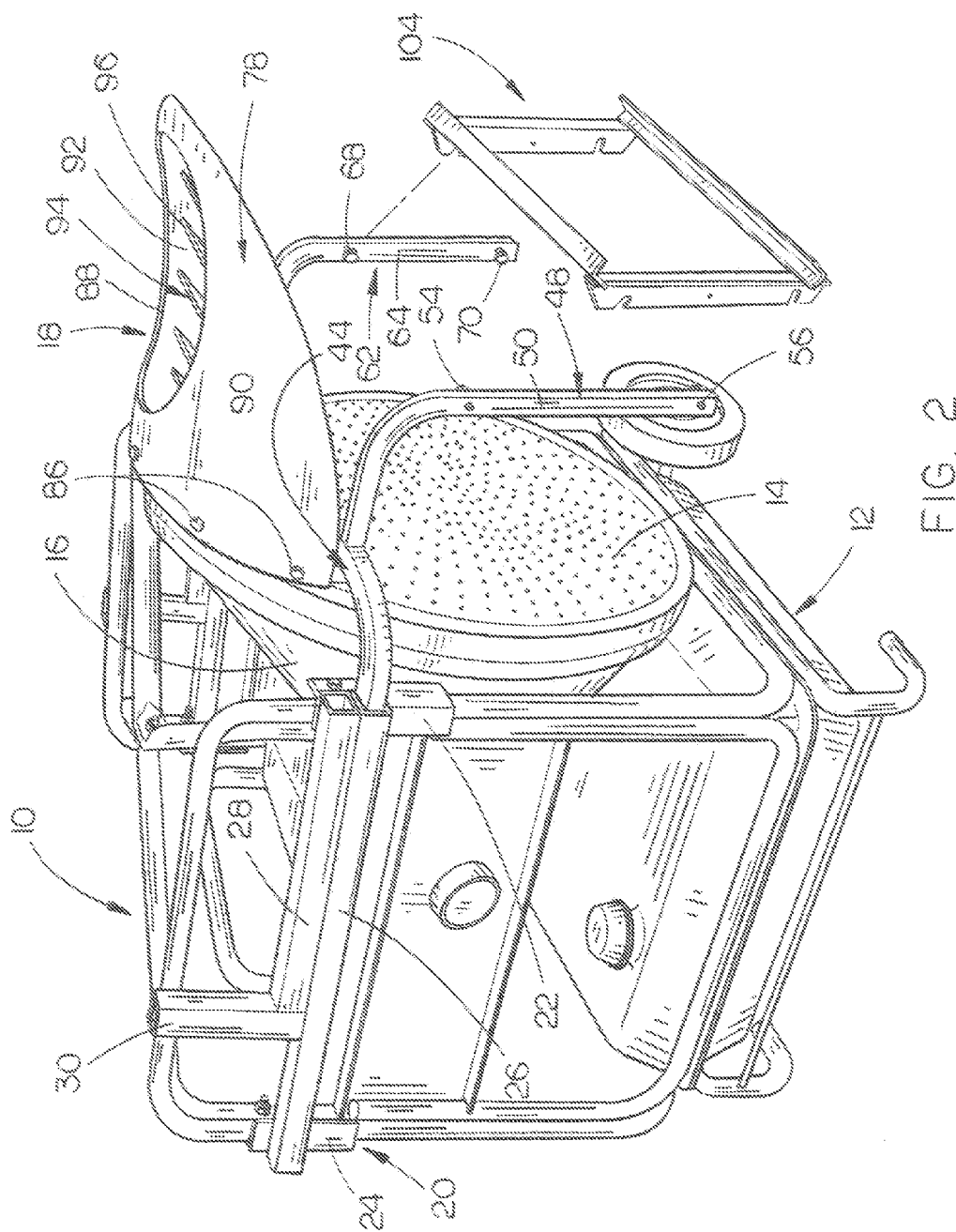
FIG. 2 is a perspective view illustrating the manner in which a cooking basket support may be secured to the apparatus of this invention.
Figure 3:
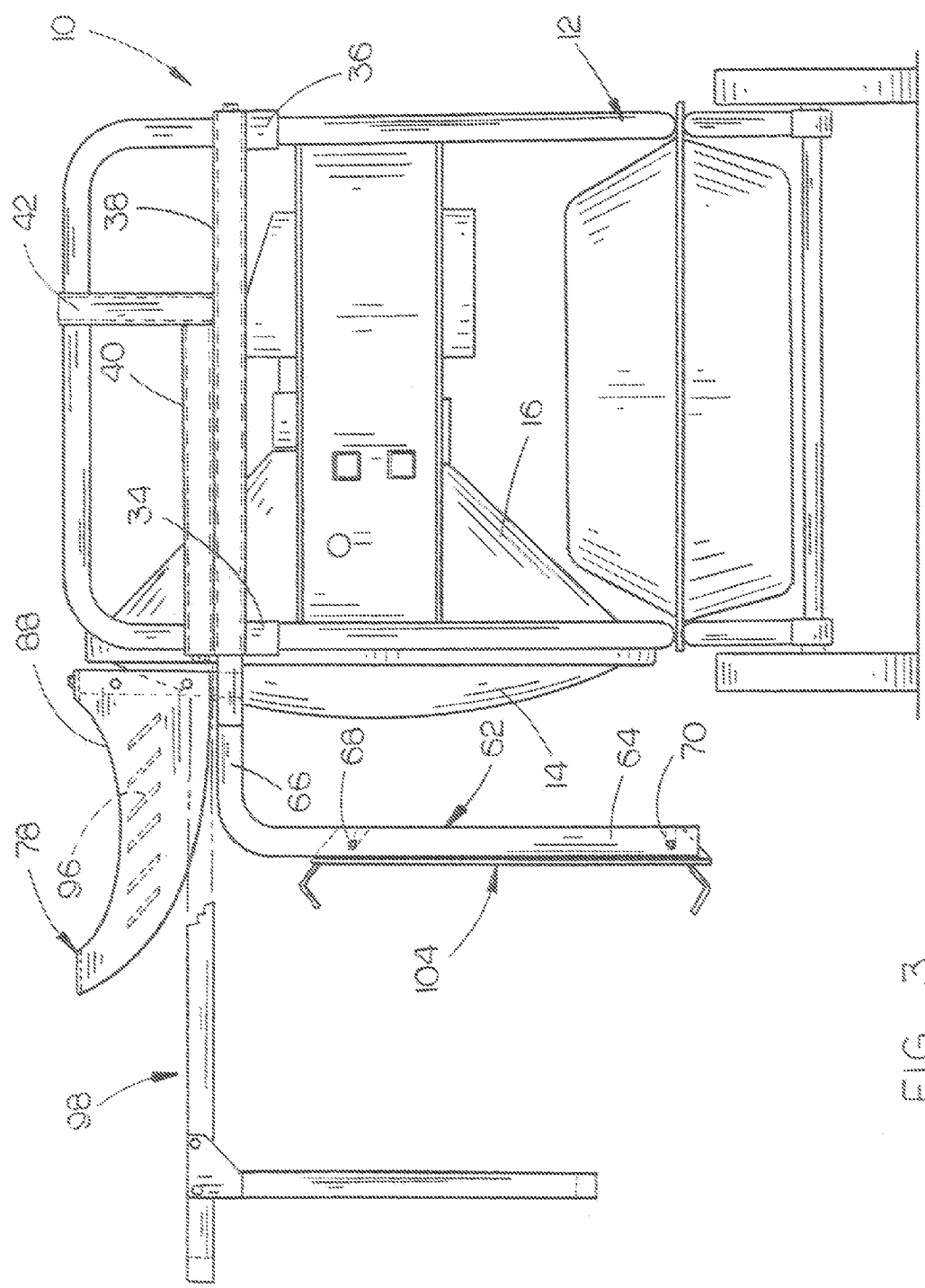
FIG. 3 is a side elevational view illustrating the apparatus of this invention as well as a protective grill and a cooking basket support.
Figure 4:
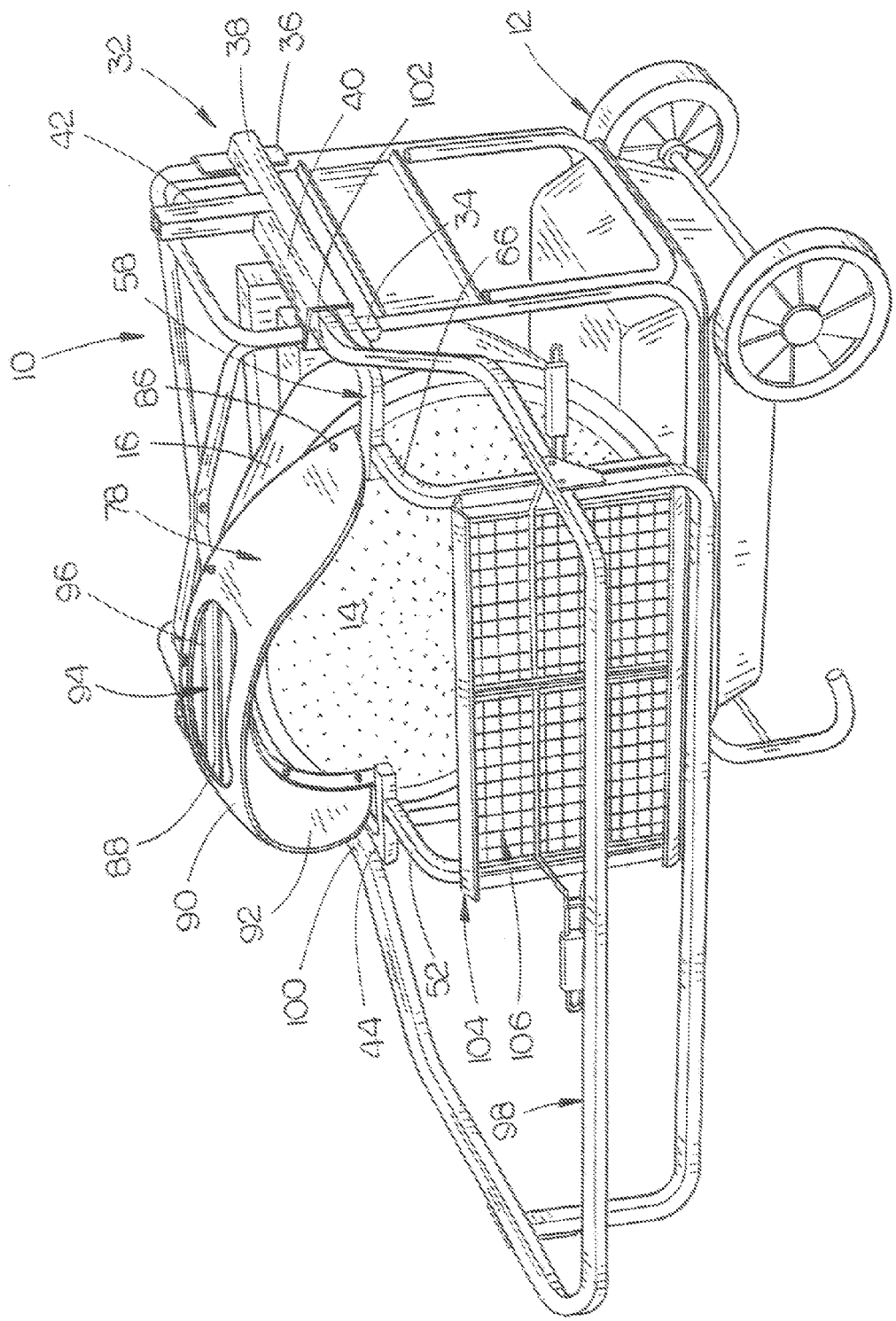
FIG. 4 is a perspective view illustrating the apparatus of this invention mounted on a heater which also shows a protective grill and a cooking basket secured to the heater.

Embodiments are described more fully below with reference to the accompanying figures, which form a part hereof and show, by way of illustration, specific exemplary embodiments. These embodiments are disclosed in sufficient detail to enable those skilled in the art to practice the invention. However, embodiments may be implemented in many different forms and should not be construed as being limited to the embodiments set forth herein. The following detailed description is, therefore, not to be taken in a limiting sense in that the scope of the present invention is defined only by the appended claims.

The numeral 10 refers to an infrared heater such as the Val6 Series heater manufactured and sold by Shizouka Seika Co., Ltd., having an address of 4-1 Yamana, Fukuroi-shi, Shizouka-ken, Japan 437-8601. The infrared heater 10 is diesel-fuel-fired and is mounted on a wheeled frame 12. Heater 10 includes a radiation disk 14 which emits infrared rays therefrom in conventional fashion. Disk 14 is mounted on the discharge end of a heating cone 16.

The apparatus of this invention is designated by the reference numeral 18. A mounting bracket 20 is secured to one side of the frame 12. Mounting bracket 20 includes a front angle bracket 22 which is secured to frame 12 and a rear angle bracket 24 which is secured to frame 12 rearwardly of front angle bracket 22. An elongated tubular member 26 is secured to angle brackets 22 and 24 and extends therebetween. An elongated tubular member 28 is secured to angle bracket 22 and tubular member 26 above tubular member 26. A vertically disposed tubular member 30 is secured to the rearward end of tubular member 28 and to tubular member 26.

A mounting bracket 32 is secured to the other side of the frame 12. Mounting bracket 32 includes a front angle bracket 34 which is secured to frame 12 and a rear angle bracket 36 which is secured to frame 12 rearwardly of front angle bracket 34. An elongated tubular member 38 is secured to angle brackets 34 and 36 and extends therebetween. An elongated tubular member 40 is secured to angle bracket 34 and tubular member 38 above tubular member 38. A vertically disposed tubular member 42 is secured to the rearward end of tubular member 38 and to tubular member 40.

The numeral 44 refers to a support tube which has an inwardly curved portion 46 at its forward end. The rearward end of support tube 44 is selectively receivable in tubular member 26 of mounting bracket 20. The numeral 48 refers to a support member having a vertically disposed portion 50 and an upper portion 52. The rearward end of upper portion 52 of support member 48 is welded to the inner end of curved portion 46 of support tube 44. A pair of vertically spaced pins 54 and 56 extend horizontally from the inner side of vertically disposed portion 50 of support member 48.

The numeral 58 refers to a support tube which has an inwardly curved portion 60 at its forward end. The rearward end of support tube 58 is selectively receivable in tube 38 of mounting bracket 32. The numeral 62 refers to a support member having a vertically disposed portion 64 and an upper portion 66. The rearward end of upper portion 66 is welded to the inner end of curved portion 60 of support tube 58. A pair of vertically spaced pins 68 and 70 extend horizontally from the inner side of vertically disposed portion 64 of support member 62.

The numeral 72 refers to a curved support having ends 74 and 76. End 74 of support 72 is secured to the inner end of curved portion 46 of support tube 44 by welding or the like and the end 76 of support 72 is secured to the inner end of curved portion 60 of support tube 58 by welding or the like so that support 72 extends between the inner ends of curved portions 46 and 60 of support tubes 44 and 58 respectively in an upwardly curved manner.

The numeral 78 refers to a downwardly curved metal visor or visor-like deflector. Deflector 78 includes a central portion 80 and side portions 82 and 84. The rearward end of deflector 78 is secured to the curved support 72 by bolts or screws 86.

A cooking utensil opening 88 is formed in deflector 78. Deflector 78 will be described as having an outer surface 90 and an inner surface 92. Apparatus 18 also includes a cooking utensil support 94 which is comprised of a plurality of elongated, spaced-apart support grid members or vanes 96. The opposite ends of the vanes 96 are welded to the inner surfaces of side portions 82 and 84 and extend therebetween below opening 88. As seen in the drawings, the vanes 96 are disposed at an angle so that the infrared rays passing through deflector 78 will be deflected upwardly and outwardly by the vanes onto a cooking utensil such as a pot or kettle which is positioned in the opening 88 and supported on the vanes 96.

When it is desired to heat water or other liquids, the liquids are placed in the cooking utensil with the utensil being positioned in the opening 88 and supported on vanes 96. The heater 10 is then energized so that the infrared rays being emitted from the radiation disk 14 will impinge on the vanes 96 which direct the rays upwardly into contact with the lower end of the utensil. The heating of the liquid in the utensil occurs rapidly due to the intense heat applied to the utensil. When the contents of the utensil have been sufficiently heated, the utensil is removed from the deflector 78. The apparatus of this invention may not only be used to heat water or soup but to cook other foods as well such as stew, roasts, etc.

The deflector 78 is easily mounted on the heater 10 by inserting the support tubes 44 and 58 into the tubes 26 and 38. If the heater 10 is not going to be used to cook or heat liquids or food, the support tubes 44 and 58 are removed from the tubes 26 and 38. If desired, the apparatus 18 may be stowed on the heater 10 by inserting the support tubes 44 and 58 into the vertically disposed tubular members 30 and 42 respectively.

The pins 54, 56, 68 and 70 provide a means to secure the cooking apparatus of the pending application Ser. No. 13/494,123 filed Jun. 12, 2012 thereon. The disclosure of Ser. No. 13/494,123 is incorporated herein by reference thereto to complete this disclosure if necessary.

If the heater 10 is to be used with a protective grill 98 such as disclosed in co-pending patent application Ser. No. 13/622,049, filed Sep. 18, 2012 entitled PROTECTIVE GRILL FOR AN INFRARED HEATER, the rearward ends of the protective grill may be inserted into the tubular members 28 and 40 respectively. The protective grill, when not being used, may be stowed on the heater 10 by inserting the ends of the protective grill into the tubular members 30 and 42 respectively. The details of the protective grill 98 are more fully disclosed in the patent application Ser. No. 13/622,049 filed Sep. 18, 2012 which is incorporated herein by reference thereto to complete this disclosure if necessary.

The structure for mounting the deflector 78 to the heater 10 also enables a wire grill basket supporting structure 104 to be selectively secured to the vertical portions 50 and 64 of supports 48 and 62. The structure 104 is selectively removably secured to the pins 45, 56, 68 and 70. A wire grill basket 106 is selectively secured to the structure 104. The details of the structure 104 and the basket 106 are disclosed in the pending patent application Ser. No. 13/494,123 filed Jun. 12, 2012, which is incorporated herein by reference thereto to complete this disclosure if necessary.

Thus it can be seen that the invention accomplishes all of its stated objectives.

Although the invention has been described in language that is specific to certain structures and methodological steps, it is to be understood that the invention defined in the appended claims is not necessarily limited to the specific structures and/or steps described. Rather, the specific aspects and steps are described as forms of implementing the claimed invention. Since many embodiments of the invention can be practiced without departing from the spirit and scope of the invention, the invention resides in the claims hereinafter appended.

The invention claimed is:

1. An apparatus for heating or cooking food or the like, comprising:
    an infrared heater having a discharge end;
    said infrared heater including a frame;
    said infrared heater including a radiation disk, having an upper end, at said discharge end thereof;
    said radiation disk emitting infrared rays therefrom when said heater is energized;
    a deflector support selectively removably secured to said frame;
    a downwardly curved deflector secured to said deflector support whereby said deflector is positioned outwardly of the upper end of said radiation disk and so that said deflector extends outwardly therefrom;
    said deflector having inner and outer surfaces;
    said deflector having an upwardly presented cooking utensil opening formed therein;
    and a horizontally disposed cooking utensil support secured to said deflector at said inner surface thereof below said cooking utensil opening;
    said cooking utensil support dwelling in a plane below said upper end of said radiation disk whereby infrared rays being emitted from said radiation disk will impinge upon said cooking utensil support and a cooking utensil positioned therein to cook or heat the contents of the cooking utensil positioned on said cooking utensil support.

2. The apparatus of claim 1 wherein said cooking utensil support comprises a plurality of spaced-apart elongated grid members.

3. The apparatus of claim 2 wherein said grid members comprise angled vanes which direct infrared rays upwardly onto a utensil positioned thereon.

4. The apparatus of claim 2 wherein said elongated grid members are transversely disposed with respect to said radiation disk.

5. The apparatus of claim 2 wherein said elongated grid members are welded to said inner surface of said deflector.

\* \* \* \* \*